(12) United States Patent
Yasuda et al.

(10) Patent No.: US 8,437,187 B2
(45) Date of Patent: May 7, 2013

(54) SEMICONDUCTOR INTEGRATED CIRCUIT INCLUDING MEMORY CELLS HAVING NON-VOLATILE MEMORIES AND SWITCHING ELEMENTS

(75) Inventors: Shinichi Yasuda, Tokyo (JP); Masato Oda, Kanagawa-ken (JP); Kumiko Nomura, Tokyo (JP); Keiko Abe, Kanagawa-ken (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/232,550

(22) Filed: Sep. 14, 2011

(65) Prior Publication Data
US 2012/0230105 A1    Sep. 13, 2012

(30) Foreign Application Priority Data
Mar. 10, 2011    (JP) ................................ P2011-053605

(51) Int. Cl.
*G11C 16/04* (2006.01)
*G11C 7/10* (2006.01)
(52) U.S. Cl.
USPC ............. 365/185.05; 365/185.17; 365/189.08
(58) Field of Classification Search .............. 365/185.05
See application file for complete search history.

(56) References Cited

U.S. PATENT DOCUMENTS

| | | | | |
|---|---|---|---|---|
| 4,833,646 A * | 5/1989 | Turner | ............................. | 326/44 |
| 5,053,646 A | 10/1991 | Higuchi et al. | | |
| 6,002,610 A * | 12/1999 | Cong et al. | ............... | 365/185.05 |
| 6,757,196 B1 * | 6/2004 | Tsao et al. | ............... | 365/185.17 |
| 6,856,542 B2 * | 2/2005 | Roy et al. | ................. | 365/185.08 |
| 7,430,137 B2 * | 9/2008 | Greene et al. | ............ | 365/185.05 |
| 7,920,424 B2 * | 4/2011 | Georgescu et al. | ...... | 365/185.14 |
| 7,929,345 B2 * | 4/2011 | Issaq | ........................ | 365/185.05 |
| 2005/0167699 A1 * | 8/2005 | Sugita et al. | .................. | 257/202 |
| 2007/0146012 A1 | 6/2007 | Murphy et al. | | |
| 2008/0197879 A1 | 8/2008 | Leung | | |
| 2011/0205780 A1 | 8/2011 | Yasuda et al. | | |

FOREIGN PATENT DOCUMENTS

WO    WO 2004/059838    7/2004

OTHER PUBLICATIONS

D. Suzuki et al., "Fabrication of a Nonvolatile Lookup-Table Circuit Chip Using Magneto/Semiconductor-Hybrid Structure for an Immediate-Power-Up Field Programmable Gate Array", 2009 Symposium on VLSI Circuits, Digest of Technical Papers, pp. 80-81 (2009).
Nishi et al., U.S. Appl. No. 13/240,087, filed Sep. 22, 2011.

* cited by examiner

*Primary Examiner* — Son Mai
(74) *Attorney, Agent, or Firm* — Finnegan, Henderson, Farabow, Garrett & Dunner, L.L.P.

(57) ABSTRACT

In one embodiment, a semiconductor integrated circuit has memory cells. Each of the memory cells has non-volatile memories and switching elements. The non-volatile memories and switching elements are connected in series between a first power source and a second power source. Output wirings of at least two of the memory cells are connected to each other. Input wirings are connected with control gates of the switching elements included in each of the at least two memory cells. A plurality of the switching elements included in one of the at least two of the memory cells is turned off, when an input signal or an inverted signal is inputted. Further, another plurality of the switching elements included in another one of the at least two of memory cells other than the one of the memory cells is turned on, when the input signal or the inverted signal is inputted.

16 Claims, 16 Drawing Sheets

SEMICONDUCTOR INTEGRATED CIRCUIT INCLUDING MEMORY CELLS HAVING NON-VOLATILE MEMORIES AND SWITCHING ELEMENTS

CROSS-REFERENCE TO RELATED APPLICATION(S)

This application is based upon and claims the benefit of priority from the prior Japanese Patent Application No. 2011-53605, filed on Mar. 10, 2011, the entire contents of which are incorporated herein by reference.

FIELD

Embodiments described herein relates generally to a semiconductor integrated circuit.

BACKGROUND

In recent years, reconfigurable integrated circuit devices attract attention. A typical example of the reconfigurable integrated circuit devices is a field programmable gate array (hereinafter referred to as "FPGA"). The FPGA realizes basic logical information using logical blocks, and changes connections among the logical blocks using switches. Using the logical blocks and the switches, a user can realizes arbitrary logical functions in the FPGA. A lookup table circuit (hereinafter referred to as "LUT circuit") which realizes an arbitrary truth table is used for such a logical block. The LUT circuit is provided with a configuration memory and a multiplexer, and reads a state of a memory selected by an input signal. The arbitrary truth table can be realized by rewriting the configuration memory.

An SRAM (Static Random Access Memory) is often used as a configuration memory. The SRAM can be manufactured by the same process as a logic transistor so that the SRAM type memory is easy to be manufactured. However, the SRAM type memory is a volatile memory and data is lost when power is turned off. Accordingly, it is necessary to keep the power of the LUT circuit turned on. Further, with advance of miniaturization of semiconductor devices, leakage current of the SRAM increases. As a result, leakage current of an LUT circuit miniaturized using most advanced processes increases.

DETAILED DESCRIPTION

Figure 1:
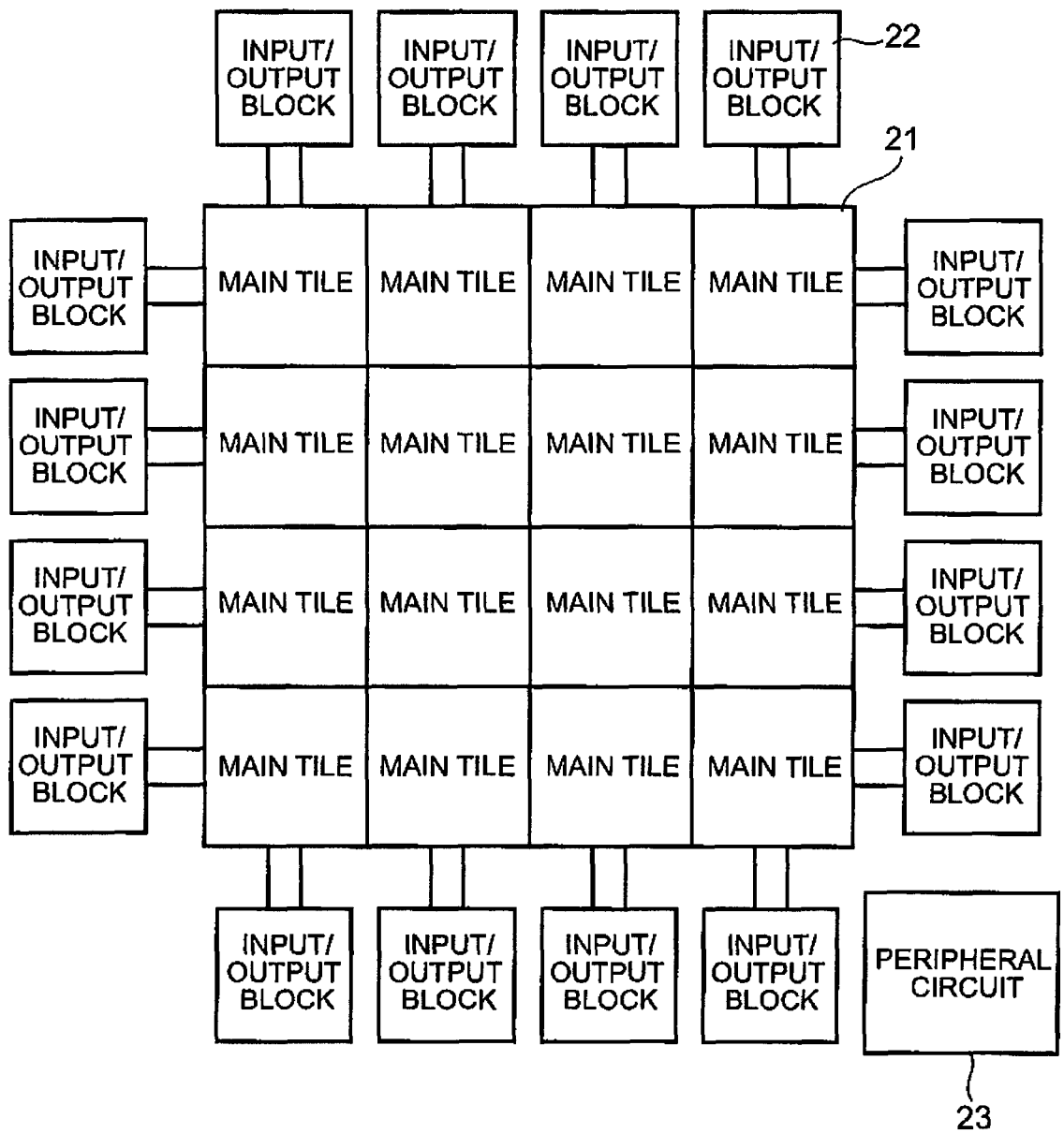
FIG. 1 is a block diagram of an FPGA according to a first embodiment.

According to one embodiment, a semiconductor integrated circuit having a plurality of memory cells is provided. Each of the memory cells has first and second non-volatile memories and a plurality of switching elements. The first and second non-volatile memories and the switching elements are connected in series between a first power source and a second power source.

Output wirings of at least two of the memory cells are connected to each other. Input wirings are connected with control gates of the switching elements included in each of the at least two memory cells, in order to send an input signal or an inverted signal of the input signal to the control gates.

The memory cells are configured such that a plurality of the switching elements included in one of the at least two of the memory cells are turned off when the input signal or the inverted signal is inputted. Further, the memory cells are configured such that another plurality of the switching elements included in another one of the at least two of memory cells other than the one of the at least two memory cells are turned on when the input signal or the inverted signal is inputted.

Hereinafter, further embodiments will be described with reference to the drawings.

In the drawings, the same reference numerals denote the same or similar portions respectively.

A first embodiment will be described with reference to FIG. 1.

FIG. 1 is a block diagram of an FPGA according to the first embodiment.

The FPGA is provided with main tiles 21, input/output blocks 22, and a peripheral circuit 23. The main tiles 21 are a circuit for performing a logical operation. The input/output blocks 22 transmit information between inside and outside of a semiconductor chip in which the FPGA is formed. The peripheral circuit 23 is provided with a circuit for supplying power to the semiconductor chip of the FPGA, a circuit for writing circuit information to the FPGA, a clock generation circuit, etc.

Figure 2:
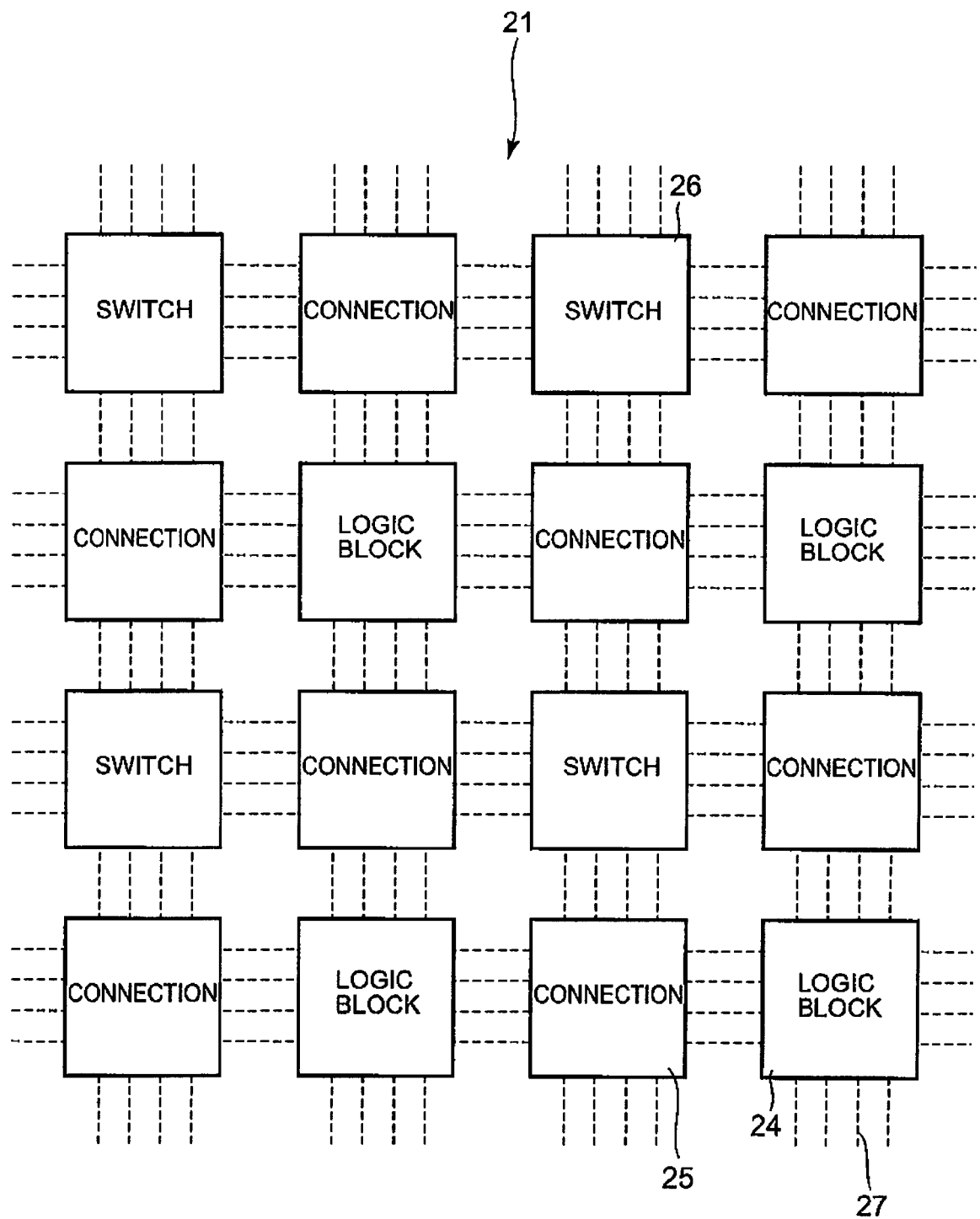
FIG. 2 is a block diagram showing an example of a main tile of the FPGA.

FIG. 2 is a block diagram showing an example of the main tiles 21. The example of the main tile 21 is provided with logical blocks 24, connection blocks 25, and switch blocks 26. These blocks 24 to 26 are connected with each other by wirings 27. The logical blocks 24 perform logical operation. The connection blocks 25 are circuits for connecting the logical blocks 24 with the wirings 27 respectively. Each connection block 25 is provided with a circuit for transmitting input signals from the connected wirings 27 to each logical block 24. Each connection block 25 is also provided with a circuit for transmitting output signals from each logical block 24 to the connected wirings 27. Each switch block 26 is composed of a switch circuit for controlling connection of the connected wirings 27 which cross each other orthogonally. The switch blocks 26 control connection and disconnection of the wirings 27 which cross each other orthogonally.

Each logical block 24 is provided with "N" pieces of logic cells, "I" pieces of input terminals, "N" pieces of output nodes, and a plurality of multiplexers. "N" and "I" show positive integers respectively. Each logic cell is a minimum unit to perform a logical operation in the FPGA. Input signals into each logical block 24 and output signals from the logic cells are transmitted to the respective multiplexers. Each multiplexer selects one of the received signals and outputs the selected signal to an input terminal of one of the logic cells.

Each logic cell is provided with, a lookup table (LUT), a D-type flip-flop (D-FF) and a multiplexer, for example, and outputs information based on input to each logic cell and information set in the lookup table.

Figure 3:
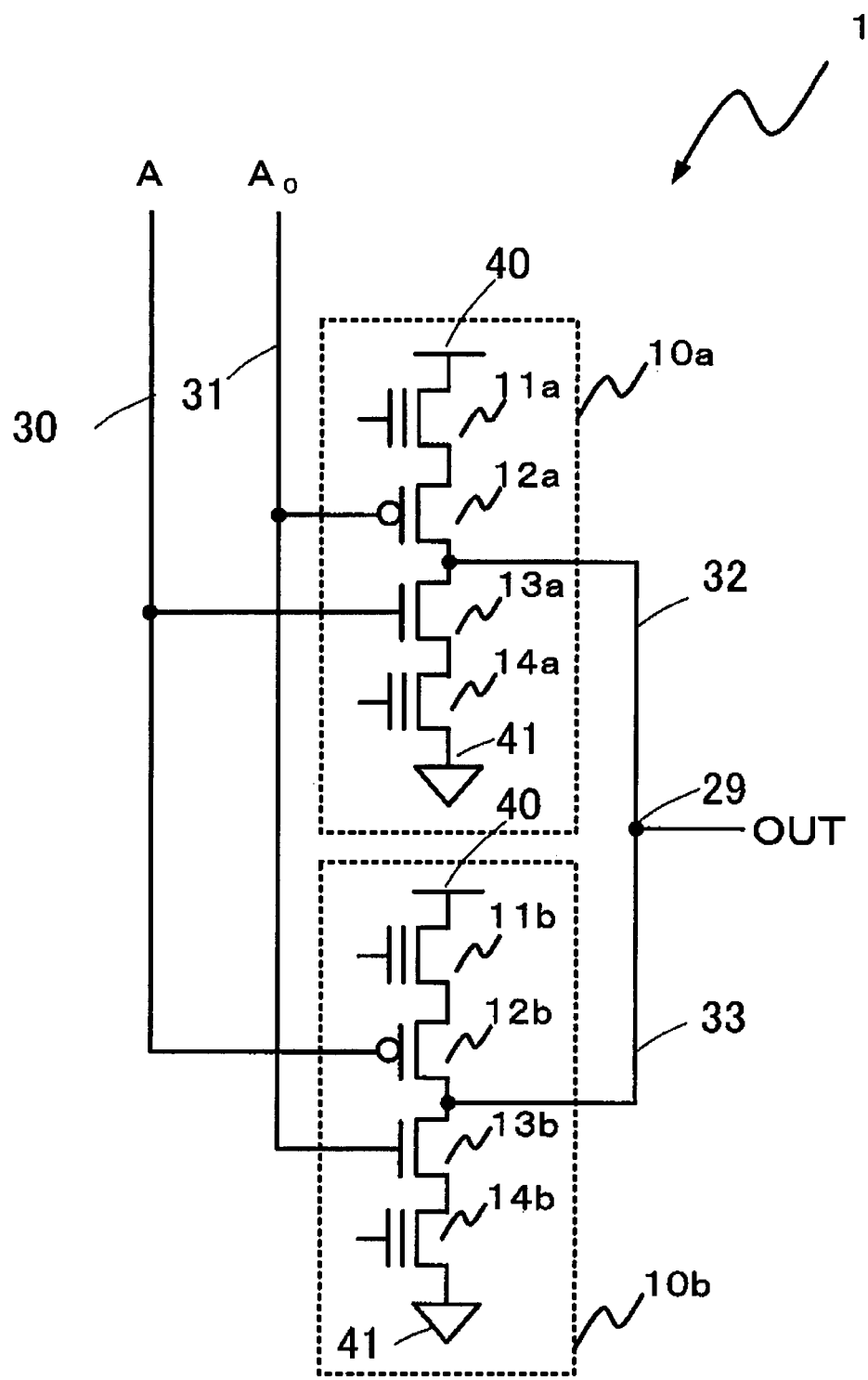
FIG. 3 is a circuit diagram showing a configuration of an LUT circuit of the FPGA.

FIG. 3 shows a configuration of an LUT circuit 1 of the FPGA according to the embodiment. FIG. 3 shows an example of an LUT circuit having one input and one output. The LUT circuit 1 is provided with a first memory cell 10a and a second memory cell 10b. Output wirings 32, 33 of the first and second memory cells 10a, 10b are connected with an output node 29. Further, the first memory cell 10a is provided with two flash memories 11a, 14a. One terminal of the flash memory 11a is connected to a first power source 40 having a voltage VDD (power source line voltage), and one terminal of the flash memory 14a is connected to a second power source 41 having a voltage VSS lower than the voltage VDD.

A P-channel insulated gate field effect transistor (hereinafter referred to as "P-channel MOSFET") 12a, as a switching element, is connected between the flash memory 11a and the output node 29, and an N-channel insulated gate field effect transistor (hereinafter referred to as "N-channel MOSFET") 13a, as a switching element, is connected between the flash memory 14a and the output node 29. Similarly to the first memory cell 10a, in the second memory cell 10b, one terminal of the flash memory 11b is connected to the first power source having the voltage VDD, and one terminal of the flash memory 14b is connected to the second power source having the voltage VSS. Further, a P-channel MOSFET 12b is connected between a flash memory 11b and the output node 29, and an N-channel MOSFET 13b is connected between a flash memory 14b and the output node 29.

In FIG. 3 and the following the description, each memory cell of the LUT circuit is provided with two flash memories and a plurality of MOSFETs. The memories of each memory cell are not limited to a flash memory, but may be another non-volatile memory such as a MONOS memory or an EEPROM (Electrically Erasable Programmable Read Only Memory), or may be a memory having a charge accumulation layer formed of a material with many dangling bonds such as SiN. Further, the MOSFETs can be replaced with other switching elements such as MEMS.

In FIG. 3 and the following drawings, the two flash memories included in each memory cell are represented by a transistor symbol having a conductivity channel of N-channel. However, the flash memory connected to the first power source may be a memory having a channel conductivity of P-channel, or both of the two flash memories may be a P-channel memory.

The flash memories 11a, 11b, 14a, 14b in the LUT circuit 1 are set to either a state where the threshold voltage is high or a state where the threshold voltage is low. The former state is set when data is written to the flash memories and a predetermined amount of electrons is injected into the floating gates. The latter state is set when data in the flash memories is erased and a predetermined amount of electrons disappears from the floating gates.

The flash memories 11a, 14a included in the same memory cell 10a are programmed to states different from each other, respectively. The flash memories 11b, 14b included in the same memory cell 10b are programmed to states different from each other, respectively. For example, when the flash memory 11a is programmed to the state of high threshold voltage, the flash memory 14a is programmed to the state of low threshold voltage. A voltage lower than the high threshold voltage and higher than the low threshold voltage is applied to the control gates of the flash memories which are programmed to the states different from each other respectively.

The control gates of the P-channel and the N-channel MOSFETs 12a, 13a in the same memory cell 10a are connected to different input wirings, i.e., a first wiring 30 and a second wiring 31. The control gates of the P-channel and the N-channel MOSFETs 12b, 13b in the same memory cell 10b are connected to the first wiring 30 and the second wiring 31 respectively. The control gates of the MOSFETs 12a, 12b having the same conductivity channel type are respectively connected to the different input wirings. The control gates of the MOSFETs 13a, 13b having the same conductivity channel type are respectively connected to the different input wirings. An input signal "A" which is inputted into the memory cells 10a, 10b through either one of the first and the second wirings 30, 31 is an input signal to the LUT circuit 1, and an inverted signal "A$_0$" of the input signal "A" is inputted into the memory cells 10a, 10b through the other one of the wirings.

The drain of the P-channel MOSFET 12a and the drain of the N-channel MOSFET 13a are connected to the output wiring 32. The drain of the P-channel MOSFET 12b and the drain of the N-channel MOSFET 13b are connected to the output wiring 33.

Logic values inputted through the first and the second wirings 30, 31 are represented by "1" and "0". In this case, for example, if "0" is provided to the control gate of the P-channel MOSFET 12a in the first memory cell 10a, "1" is provided to the control gate of the N-channel MOSFET 13a in the first memory cell 10a, "1" is provided to the control gate of the P-channel MOSFET 12b in the second memory cell 10b, and "0" is provided to the control gate of the N-channel MOSFET 13b in the second memory cell 10b.

When such logic values are provided, the P-channel MOSFET 12a and the N-channel MOSFET 13a in the first memory cell 10a are turned on. When the flash memory 11a is set to the low threshold voltage and the flash memory 14a is set to the high threshold voltage, a voltage near the voltage VDD which is a higher voltage is outputted from the first memory cell 10a. When the flash memory 14a is set to the low threshold voltage and the flash memory 11a is set to the high threshold voltage, a voltage near the voltage VSS which is a lower voltage is outputted from the first memory cell 10a. On the other hand, the P-channel MOSFET 12b and the N-channel MOSFET 13b in the second memory cell 10b are turned off. Accordingly, the output value of the first memory cell 10a is outputted to the output node 29. As described, output terminals (output wirings) of the two memory cells 10a, 10b are connected to each other. Either one of the two memory cells is turned on. As a result, the state of the turned-on memory cell is outputted to the common output node 29.

As described above, in the LUT circuit 1, one of the two memory cells 10a, 10b is certainly turned off according to the input signal to the LUT circuit 1. Accordingly, a leakage current which is generated from the turned-off memory cell can be reduced to a value near zero. Thus, the leakage current during running of the LUT circuit 1 can be reduced to one-half compared with a case where all the memory cells are turned on.

In the LUT circuit 1, four elements are inserted in a leakage path between the first power source of the voltage VDD and the second power source of the voltage VSS in each memory cell so that the leakage current is sufficiently suppressed. The LUT circuit 1 can be used more effectively when leakage currents from the MOSFETs 12a, 12b, 13a, 13b are adjusted to be smaller than leakage currents from the flash memories 11a, 11b, 14a and 14b in the memory cells 10a, 10b. For example, the first memory cell 10a can be adjusted so as to satisfy the formula (1). In the formula (1), $I_{11a}, I_{12a}, I_{13a}, I_{14a}$ indicate leakage currents from the flash memory 11a, MOSFET 12a, MOSFET 13a and the flash memory 14a respectively, and Min (X, Y) indicates a smaller value of X and Y.

$$\text{Min}(I_{12a}, I_{13a}) < \text{Min}(I_{11a}, I_{14a}) \tag{1}$$

The leakage currents of the MOSFET 12a, 12b can be adjusted by changing the gate lengths, the gate widths or the threshold voltages of the MOSFET 12a, 12b. Accordingly, the MOSFET 12a, 12b may be designed so that the formula (1) is satisfied, according to the characteristics of the flash memories 11a, 14a to be used. Further, the leakage currents of the flash memory 11a, 14a depend on the gate lengths, the threshold voltages, voltages applied to the control gates, and the amounts of shift of the threshold voltages caused by writing/erasing data. Accordingly, the flash memories 11a, 14a may be designed so that the formula (1) is satisfied, considering the characteristics of the MOSFET 12a, 12b to be used. Thus, a smaller sized flash memory may be used. The threshold values of the MOSFET 12a, 12b or the flash memories 11a, 14a may be controlled by a substrate bias.

Operations of writing data to the flash memories and erasing data from the flash memories will be described below. Writing data to the two flash memories of each memory cell is performed by controlling the voltages VDD, VSS and the voltages of the control gates of the flash memories to which the data is written. The voltage VDD is applied from the first power source to which one of the flash memories is connected. The voltage VSS is applied from the second power source to which the other one of the flash memories is connected.

The potential difference between the control gate of one of the flash memories to which data is written and the first or the second power sources which is electrically connected to the one of the flash memories is set to a program voltage Vprg. For example, the potential of the control gate of the flash memory is set to Vprg, and the potential of at least one of the first and the second power source is set to 0 (Zero) V. As a result, the voltage between the gate and the channel of the one of the flash memories becomes Vprg so that information can be written to the one of the flash memories.

Figure 4:
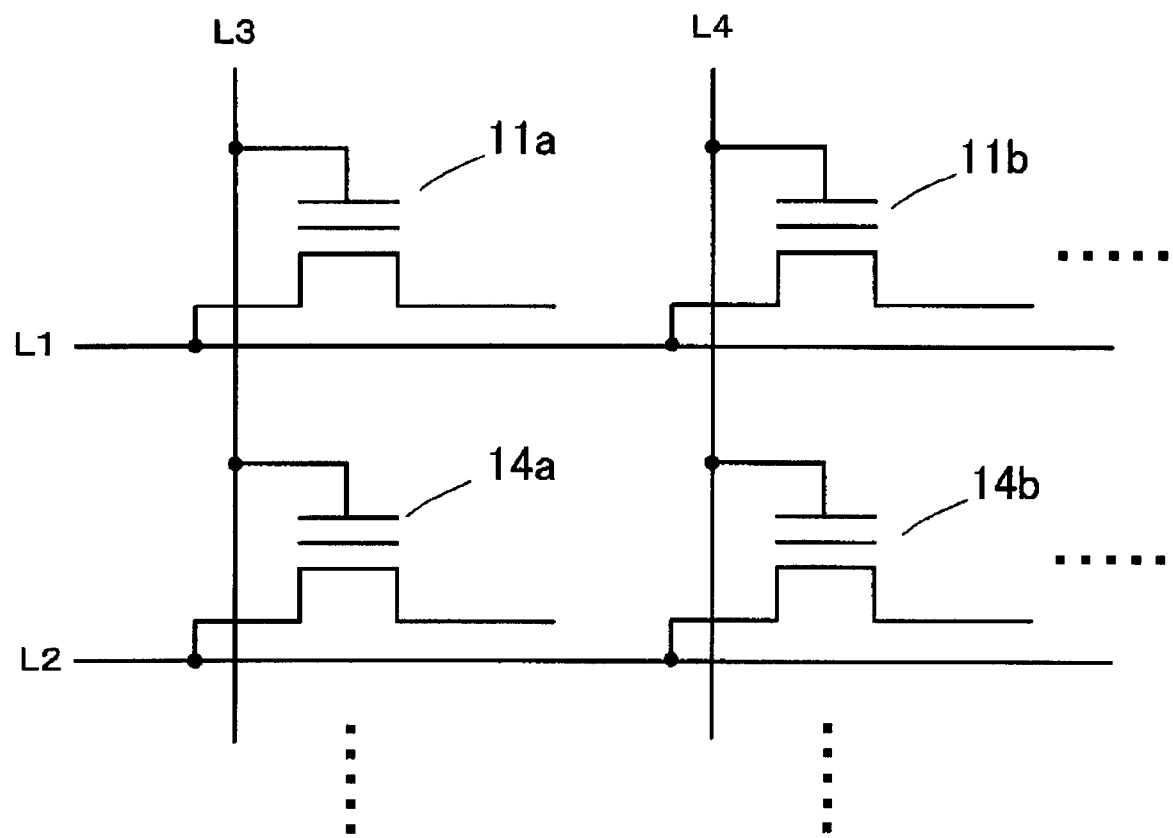
FIG. 4 is a diagram showing an arrangement of flash memories in the LUT circuit.

The flash memories 11a, 11b, 14a and 14b in the LUT circuit 1 are arranged in a matrix form, for example, as shown in FIG. 4. The control gates of the flash memories 11a, 14a are connected to the same wiring L3. The control gates of the flash memories 11b, 14b are connected to the same wiring L4. One terminals, for example, sources of the flash memories 11a, 11b are connected to the same wiring L1, i.e., a power source line. One terminals, for example, sources of the flash memories 14a, 14b are connected to the same wiring L2, i.e., another power source line.

To write data to one of the flash memories without writing data to the other flash memories whose control gates are connected to the same wiring, the potential of the power source line connected to the other flash memories to which data is not written is set to a voltage Va slightly higher than zero. Thus, the voltage between the gates and the channels of the other flash memories to which data is not written becomes Vprg−Va so that data can be prevented from being written.

When data is erased in the one of the flash memories, the potential difference between the control gate of the one of the flash memories in which data is erased and the second power source (substrate) is set to Verase. For example, the gate potential is set to 0 V and the substrate potential is set to Verase. Thus, all data in the flash memories formed on a common substrate can be erased.

Figure 5:
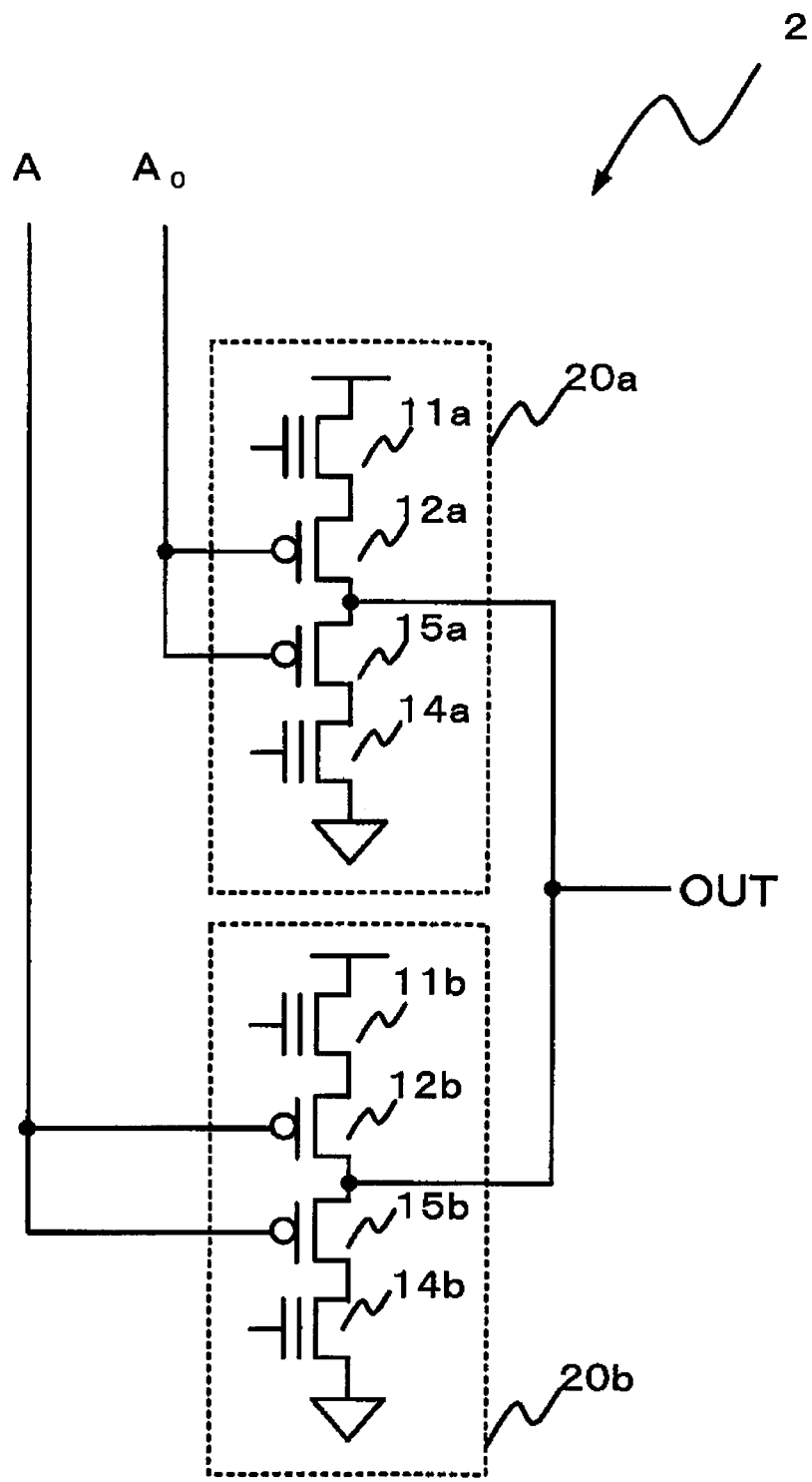
FIG. 5 is a circuit diagram showing a modification of the LUT circuit.

In the LUT circuit 1 of FIG. 3, both the N-channel MOSFET and the P-channel MOSFET are used in each memory cell. However, MOSFETs having the same conductivity channel type may be used in each memory cell. FIG. 5 shows a modified example of an LUT circuit in which MOSFETs of the same conductivity channel type are used in each memory cell.

In an LUT circuit 2 shown in FIG. 5, all of MOSFETs 12a, 12b, 15a and 15b included in the LUT circuit 2 are P-channel MOSFETs. In the LUT circuit 2, an input signal "A" is inputted into control gates of the MOSFETs 12b, 15b of the second memory cell 20b. An inverted signal "$A_0$" of the input signal is inputted into control gates of the MOSFETs 12a, 15a of the other memory cell 20a. All of the MOSFETs of FIG. 5 may be N-channel MOSFETs.

In the LUT circuit 2 described above, one of the two memory cells 20a, 20b is certainly turned off according to the input signal to the LUT circuit 2. Thus, a leakage current generated from the turned-off memory cell can be reduced to a value near zero. Further, a leakage current during running of the LUT circuit 2 can be reduced to one-half compared with a case where all of the memory cells are turned on.

Figure 6:
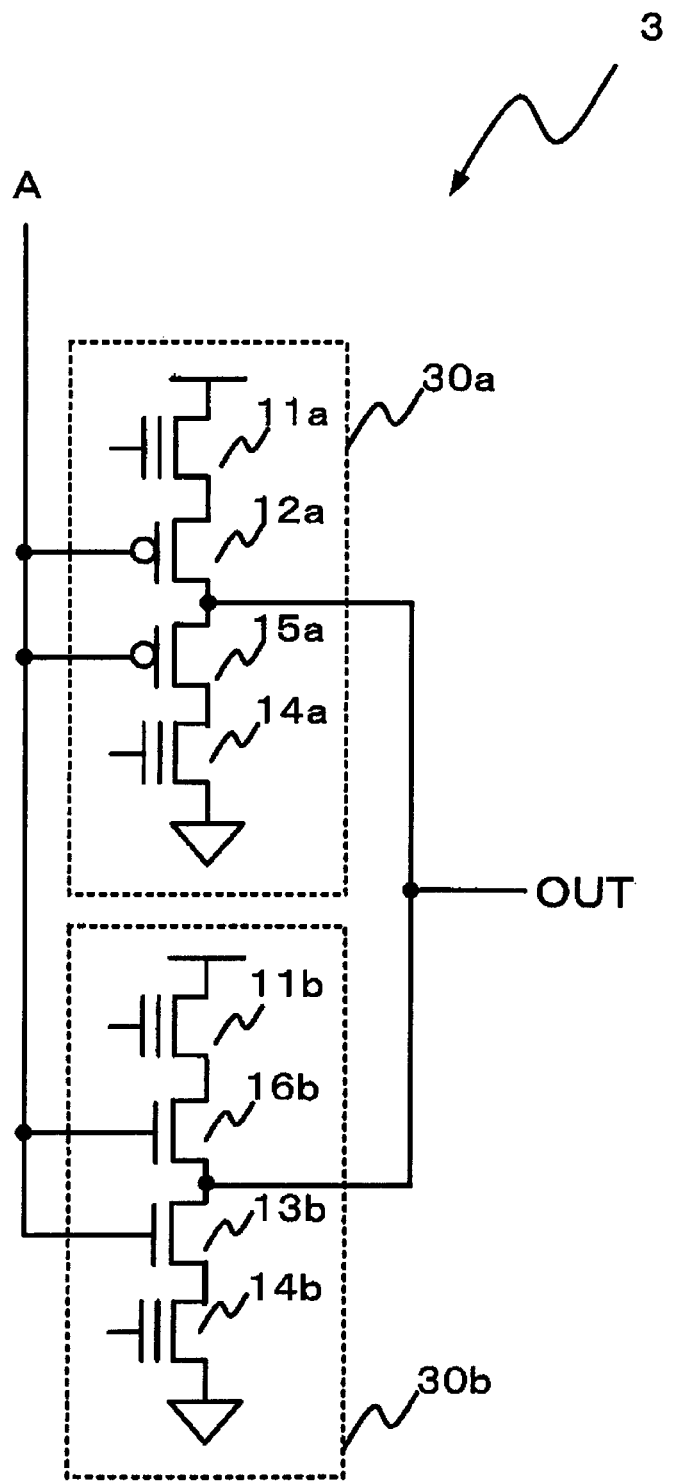
FIG. 6 is a circuit diagram showing another modification of the LUT circuit.

FIG. 6 shows another modified example of the LUT circuit in which MOSFETs of the same conductivity channel type are used in each memory cell. In an LUT circuit 3 of FIG. 6, MOSFETs 12a, 15a of a first memory cell 30a have a conductivity channel type different from that of MOSFETs 13b, 16b of a second memory cell 30b. In the LUT circuit 3, an input signal "A" is inputted into control gates of all of the MOSFETs 12a, 13b, 15a and 16b. Accordingly, though the wiring 31 for inputting the inverted signal "$A_0$" is necessary in the LUT circuits 1, 2 shown in FIGS. 3 and 5, such a wiring is not necessary in the LUT circuit 3 shown in FIG. 6.

In the LUT circuit 3 described above, one of the two memory cells is certainly turned off according to the input signal to the LUT circuit 3. As a result, a leakage current during running of the LUT circuit 3 can be reduced to one-half compared with a case where all the memory cells are turned on.

Figure 7:
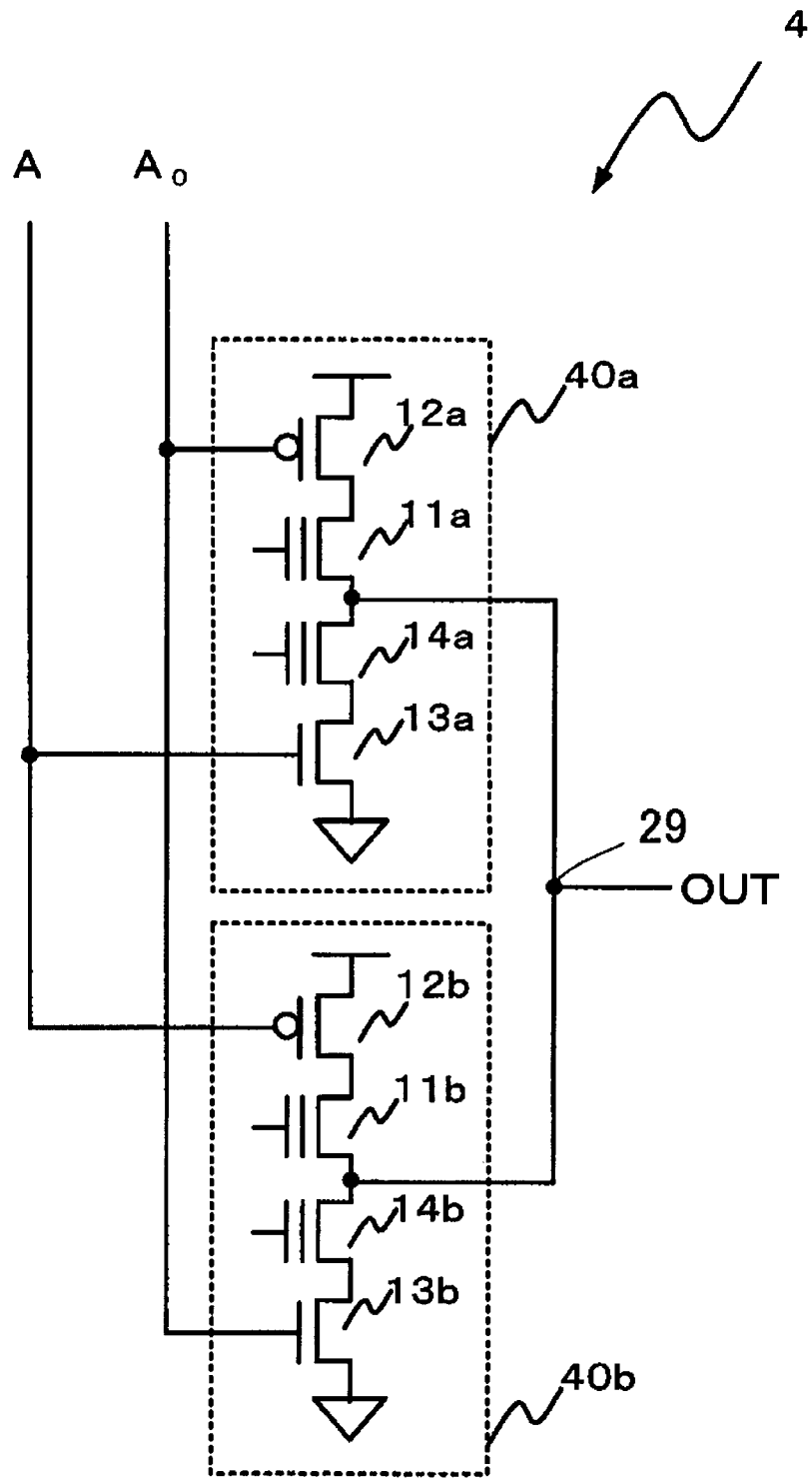
FIG. 7 is a circuit diagram showing further another modification of the LUT circuit.

FIG. 7 shows further another modified example of the LUT circuit. In the LUT circuit 4, MOSFETs 12a, 12b are arranged nearer to the first power source than the flash memories 11a, 11b. MOSFETs 13a, 13b are arranged nearer to the second power source than the flash memories 14a, 14b. The flash memories 11a, 14a, 11b and 14b are arranged nearer to the output node 29. In the LUT circuit 4, the flash memory elements 11a, 14a are arranged adjacent to each other, and the flash memory elements 11b, 14b are arranged adjacent to each other. As a result, the layout area can be suppressed to be small.

In the LUT circuit 4, the MOSFET 12a is formed between the flash memory 11a and the first power source, the MOSFET 13a is formed between the flash memory 14a and the second power source. The MOSFET 12b is formed between the flash memory 11b and the first power source, and the MOSFET 13b is formed between the flash memory 14b and the second power source. Accordingly, when information is written to one of the flash memories of each memory cell, it is necessary to form an electric path for the one of the flash memories, by controlling the input/inverted signal "A" or "$A_0$" to be transmitted to the MOSFET adjacent to the one of the flash memories so as to turn on the MOSFET.

On the other hand, in the LUT circuit 1 shown in FIG. 3, when information is written to one of the flash memories 11a, 14a, 11b and 14b, it is not necessary to control any of the input/inverted signals "A", "$A_0$".

In FIG. 7, a P-channel MOSFET 12a, flash memories 11a, 14a, and an N-channel MOSFET 13a are arranged, in the order from a node near the first power source to a node near the second power source. Further, a P-channel MOSFET 12b, flash memories, 11b, 14b, and an N-channel MOSFET 13b are arranged, in the order from a node near the first power source to a node near the second power source. The arrangements may be changed to those different from the arrangements described above. For example, a MOSFET, a flash memory, a MOSFET and a flash memory may be arranged, in the order from near the first power source to near the second power source, or a flash memory, a MOSFET, a flash memory and a MOSFET may be arranged in the above order.

Further, in FIG. 7, the P-channel MOSFET 12a and the N-channel MOSFET 13a are included in the memory cell 40a, and the P-channel MOSFET 12b and the N-channel MOSFET 13b are included in the memory cell 40b. In the LUT circuit 4 of FIG. 7, MOSFETs of the same channel type may be provided in each memory cell 40a or 40b.

Figure 8:
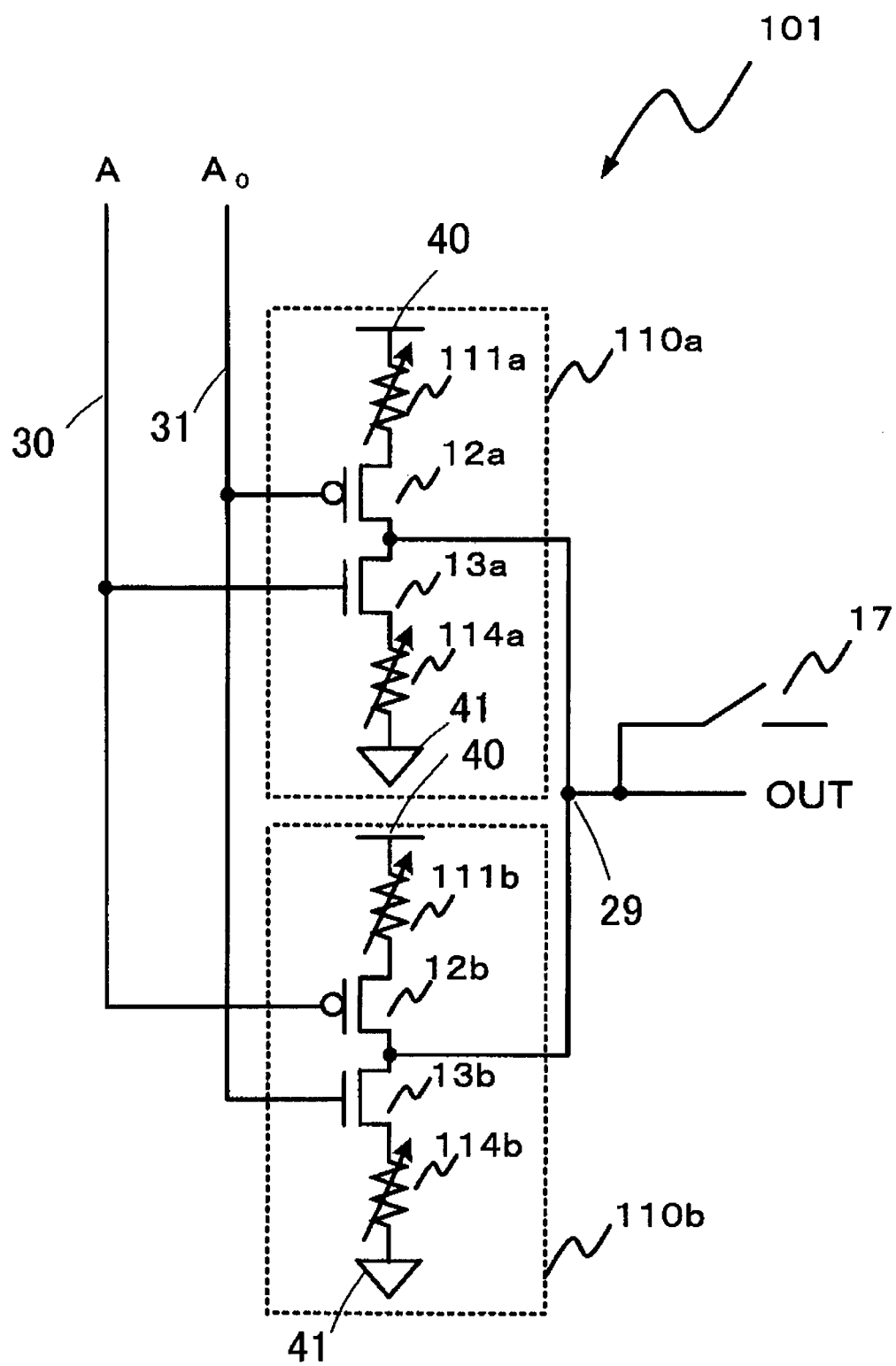
FIG. 8 is a circuit diagram showing a configuration of an LUT circuit of an FPGA according to a second embodiment.

FIG. 8 is a circuit diagram showing a configuration of an LUT circuit of an FPGA according to a second embodiment. In the embodiment, the LUT circuit is composed of resistance change memories as non-volatile memories. The constituent elements other than the LUT circuit of the FPGA are the similar to those of the first embodiment.

The resistance change memory is a memory element. The resistance value of the resistance change memory can be programmed by determining a voltage value between the terminals of the resistance change memory and a direction of the voltage. The resistance change memory is, for example, a spin torque transfer MRAM, a phase change memory, a resistance change memory using an electric field effect, and an ion memory. A resistance change memory which is programmed to a low resistance state or a high resistance state by changing amplitude and application time of a voltage applied between the terminals is referred to as a unipolar type memory. A resistance change memory which is programmed to a low resistance state or a high resistance state by changing a direction of a voltage applied between the terminals is referred to as a bipolar type memory.

In the resistance change memories of the unipolar type and the bipolar type, the resistance state is changed in a reversible manner from the high resistance state to the low resistance state or from the low resistance state to the high resistance state, by applying a predetermined program voltage (or current) between the terminals. The resistance state of the resistance change memories is substantially non-volatile until a predetermined program voltage is applied.

As shown in FIG. 8, an LUT circuit 101 is provided with memory cells 110a, 110b. The memory cell 110a is provided with resistance change memories 111a, 114a, a P-channel MOSFET 12a, and an N-channel MOSFET 13a. The memory cell 110b is provided with resistance change memories 111b, 114b, a P-channel MOSFET 12b, and an N-channel MOSFET 13b. One terminals of the resistance change memories 111a, 111b are connected to the first power source of the voltage VDD (a power source line voltage), and the other terminals of the resistance change memories 111a, 111b are respectively connected to the MOSFETs 12a, 12b. One terminals of the resistance change memories 114a, 114b are respectively connected to the MOSFETs 13a, 13b, and the other terminals of the resistance change memories 114a, 114b are connected to the second power source having the voltage VSS lower than the voltage VDD.

The resistance change memories 111a, 111b, 114a, 114b are assumed to be unipolar type memories. The resistance change memories 111a, 114a included in the same memory cell 110a are programmed to states different from each other. The resistance change memories 111b, 114b included in the same memory cell 110b are programmed to states different from each other. For example, when the resistance change memory 111a is programmed to a high resistance state, the resistance change memory 114a is programmed to a low resistance state.

Similarly to the MOSFETs described in the first embodiment, the channel types of the MOSFETs 12a, 13a, 12b and 13b and the input/inverted signals to the control gates of the MOSFETs are set as follows. When the input signal "A" and the inverted signal "$A_0$" are inputted into the LUT circuit 101, the two MOSFETs included in one of the two memory cells 110a, 110b are turned on, and the two MOSFETs included in the other one of the memory cells are turned off.

As described, in the LUT circuit 101 using the resistance change memories, one of the two memory cells 110a, 110b is certainly turned off according to the input/inverted signals "A", "$A_0$" provided to the LUT circuit 101. As a result, a leakage current generated from the turned-off memory cell can be reduced to a value near zero. Accordingly, a leakage current during running of the LUT circuit 101 can be reduced to one-half compared with a case where all of the memory cells are turned on.

In the LUT circuit 101, four elements are inserted in a leakage path between the first power source 40 and the second power source 41 for each memory cell 110a, 110b so that the leakage current is reduced. The LUT circuit 101 can be used more effectively when a leakage current from the MOSFETs is adjusted to be smaller than a leakage current from the resistance change memories in each of the memory cells 110a, 110b. For example, the memory cell 110a is adjusted so that the formula (2) may be satisfied. In the formula (2), $I_{12a}$, $I_{13a}$, $I_{111a}$, $I_{114a}$ indicate leakage currents from the MOSFETs 12a, 13a and the resistance change memories 111a, 114a, respectively.

$$\text{Min}(I_{12a}, I_{13a}) < \text{Min}(I_{111a}, I_{114a}) \qquad (2)$$

The leakage currents of the resistance change memories 111a, 111b, 114a, 114b can be adjusted by areas, film thicknesses, and materials of the resistance change memories. The leakage currents of the MOSFETs 12a, 13a, 12b, 13b can be adjusted by changing the gate lengths, the gate widths, and the threshold voltages of the MOSFETs. Thus, the resistance change memories may be designed so as to satisfy the formula (2), according to the characteristics of the resistance change memories to be used, or the threshold values of the MOSFET 12a, 13a, 12b and 13b may be controlled by using a substrate bias.

Operation of writing data to the resistance change memories 111a, 114a and operation of erasing data from the resistance change memories will be described for the case of using the memory cell 110a of the LUT circuit 101, as an example.

In order to write data to the resistance change memory 111a and to erase data from the resistance change memory, the MOSFETs 12a, 13a are turned on. The MOSFETs 12a, 13a have a function of a selection transistor to select resistance change memories.

Further, the power source line of the first power source 40 on the higher voltage side is switched from the high voltage power source to a program power source. The power source line of the second power source 41 on the lower voltage side is set to a floating state. Thus, the program voltage is applied between the power source line of the first power source and the common output node 29 of the memory cell 110a so that data can be written to the resistance change memory 111a or data can be erased from the resistance change memory 111a.

On the other hand, in order to write data to the resistance change memory 114a and to erase data from the resistance change memory, the power source line of the second power source on the lower voltage side is switched from the lower voltage power source to the program power source. The power source line of the first power source 40 on the higher voltage side is set to the floating state. Thus, the program voltage is applied between the power source line of the second power source 41 and the common output node 29 so that data can be written to the resistance change memory 114a and data can be erased from the resistance change memory 114a.

In order to apply a voltage between the power source lines and the output node 29, a switch 17 is connected to the output node 29. When the memory cells 110a, 110b are programmed, it is possible to switch the connection of the power source lines.

Operation of writing data to the resistance change memories and operation of erasing data from the resistance change memories will be described below for a case where the resistance change memories included in the LUT circuit 101 are bipolar type memories.

Figure 9:
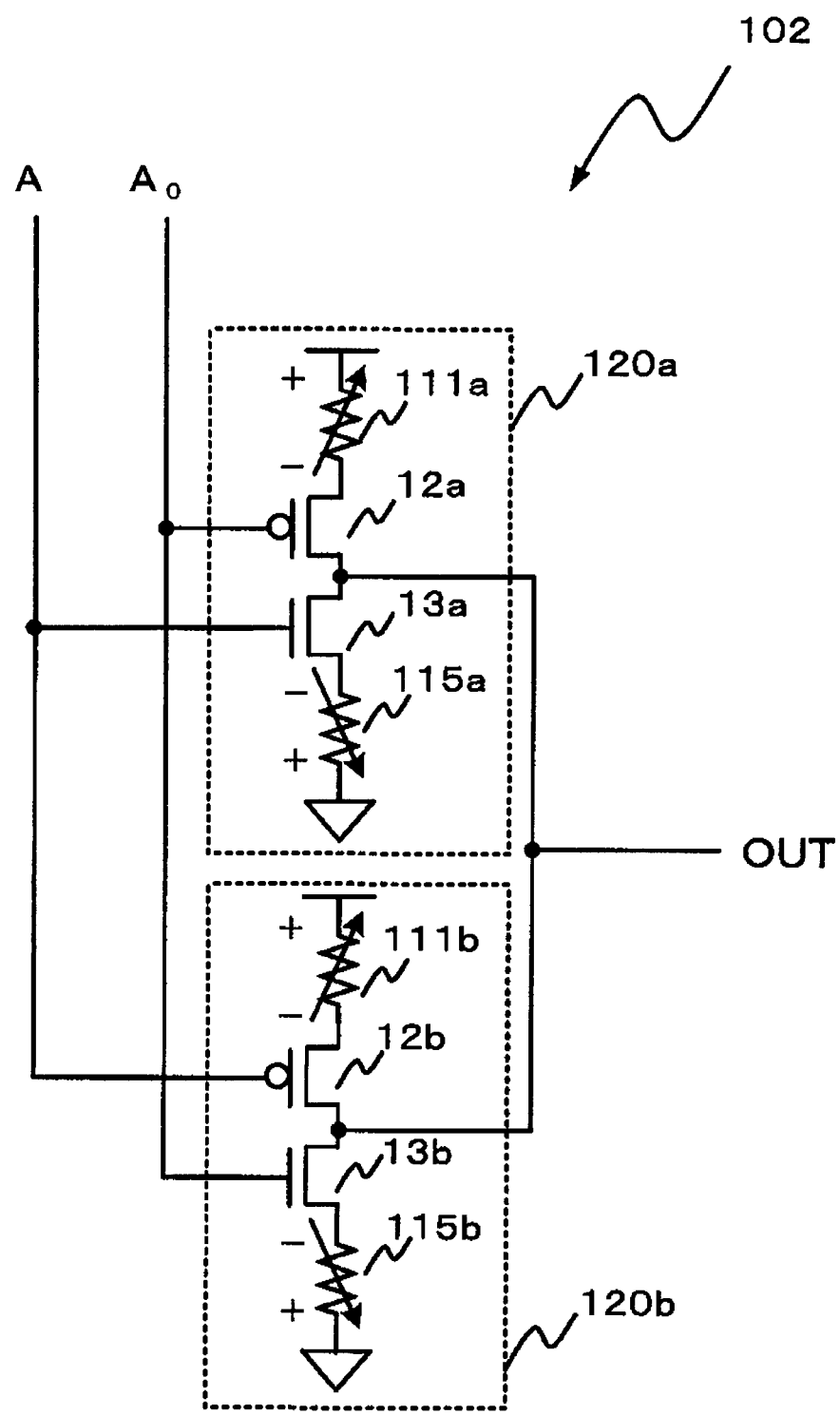
FIG. 9 is a circuit diagram showing a modification of the LUT circuit of the FPGA according to the second embodiment.

FIG. 9 shows a modified example of the LUT circuit of the second embodiment. An LUT circuit 102 shown in FIG. 9 uses bipolar type resistance change memories. In the case that the resistance change memories are bipolar type, even if a switch for changing the power source lines is not connected to the output node of the LUT circuit 102, data can be written to the resistance change memories and can be erased from the memories.

The LUT circuit 102 can be used more effectively when a leakage current from the MOSFETs is adjusted to be smaller than a leakage current from the resistance change memories in each of the memory cells 120a, 120b. For example, the memory cell 120a is adjusted so that the formula (3) may be satisfied. In the formula (3), $I_{12a}$, $I_{13a}$, $I_{111a}$, $I_{115a}$ indicate leakage currents from the MOSFETs 12a, 13a and the resistance change memories 111a, 115a, respectively.

$$\text{Min}(I_{12a}, I_{13a}) < \text{Min}(I_{111a}, I_{115a}) \qquad (3)$$

In this case, the resistance change memories included in the same memory cell, for example, the resistance change memories 111a, 115a are arranged so that different polarities are aligned in series in a direction from the first power source to the second power source. Each polarity is represented by "+" or "−". In this case, when the resistance change memory 111a is arranged such that the polarities of the resistance change memory 111a are "+−" in the direction from the first power source to the second power source, the resistance change memory 115a is arranged such that the polarities of the resistance change memory 115a are "−+". Alternatively, when the resistance change memory 111a is arranged such that the polarities of the resistance change memory 111a are "−+" in the direction from the first power source to the second power source, the resistance change memory 115a is arranged such that the polarities of the resistance change memory 115a are "+−".

When data is written to the bipolar type resistance change memories 111a, 115a or data is erased from the bipolar type resistance change memories, the MOSFETs 12a, 13a are turned on. Further, the power source line of the first power source on the higher voltage side is switched from the higher voltage power source to a first program power source. The lower power source line of the second power source on the lower voltage side is switched from the lower voltage power source to a second program power source. As a result, the resistance change memories 111a, 115a are programmed to states different from each other at the same time, according to a direction of potential difference between the first program power source and the second program power source.

In this way, when the bipolar type resistance change memories 111a, 115a, 111b and 115b are used, it is not necessary to provide a switch connected with the output node so that the area of the LUT circuit 102 can be smaller than that of the LUT circuit using unipolar type resistance change memories.

Figure 10:
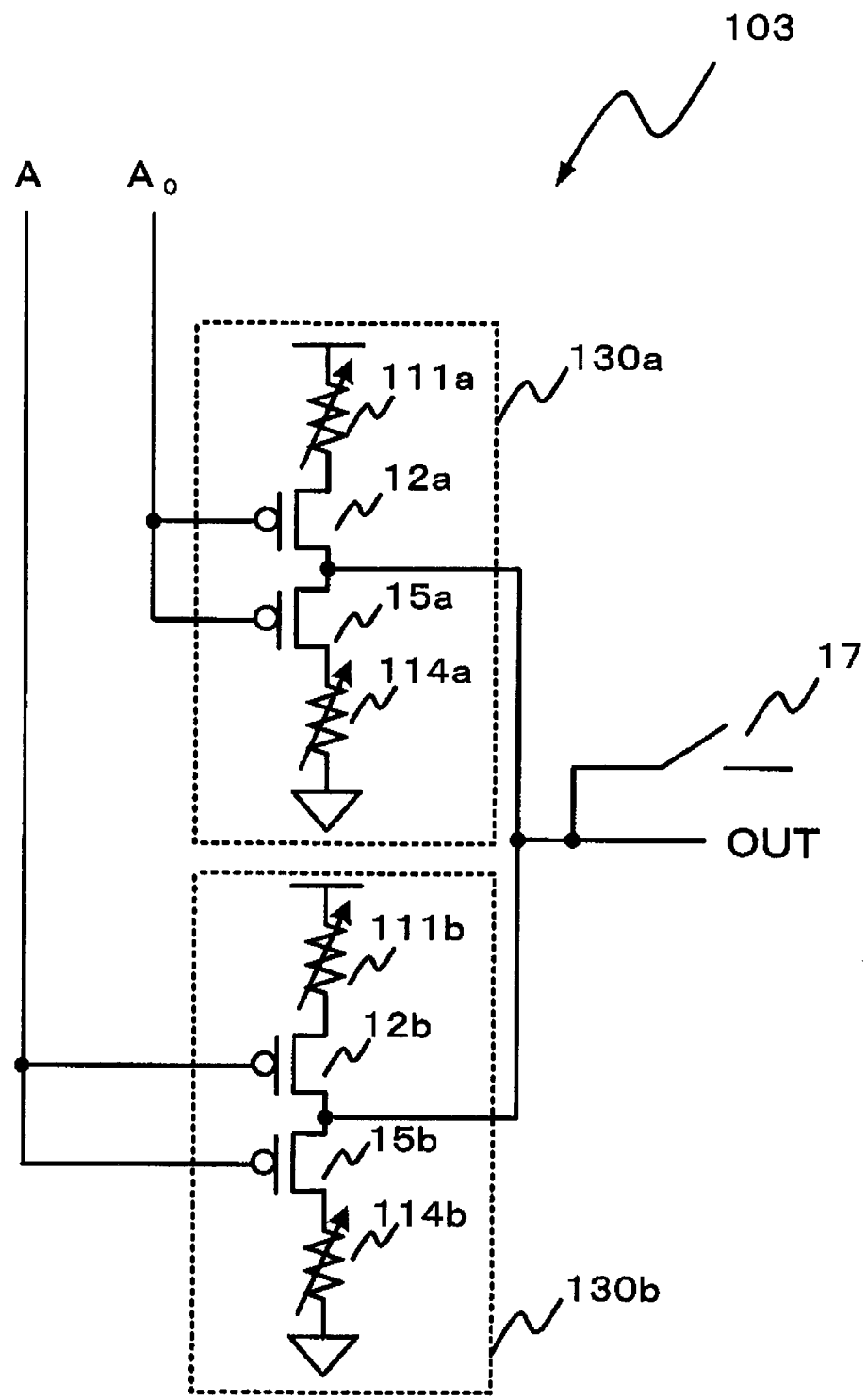
FIG. 10 is a circuit diagram showing another modification of the LUT circuit of the FPGA according to the second embodiment.

FIG. 10 shows another modified example of the LUT circuit of the second embodiment. As shown in FIG. 10, similarly to the LUT circuit of FIG. 5, all of the MOSFETs 12a, 15a, 12b and 15b provided in the memory cells 130a, 130b of the LUT circuit 103 have the same conductivity channel type.

Figure 11:
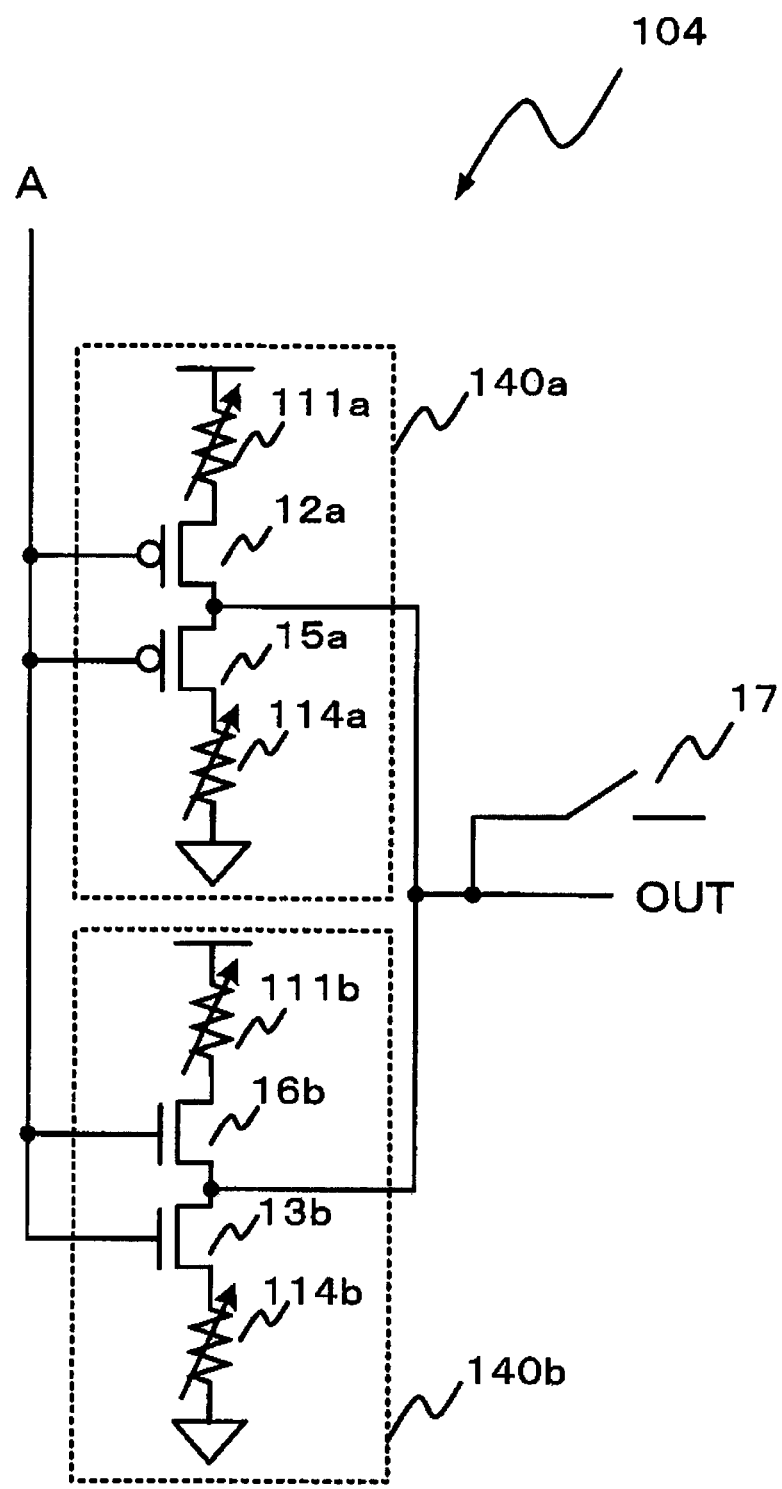
FIG. 11 is a circuit diagram showing further another modification of the LUT circuit of the FPGA according to the second embodiment.

FIG. 11 shows further another modified example of the LUT circuit of the second embodiment. Similarly to the LUT circuit of FIG. 6, in an LUT circuit 103 shown in FIG. 11, MOSFETs 12a, 15a of a memory cell 140a have a conductivity type different from that of MOSFETs 13b, 16b of a memory cell 140b.

Figure 12:
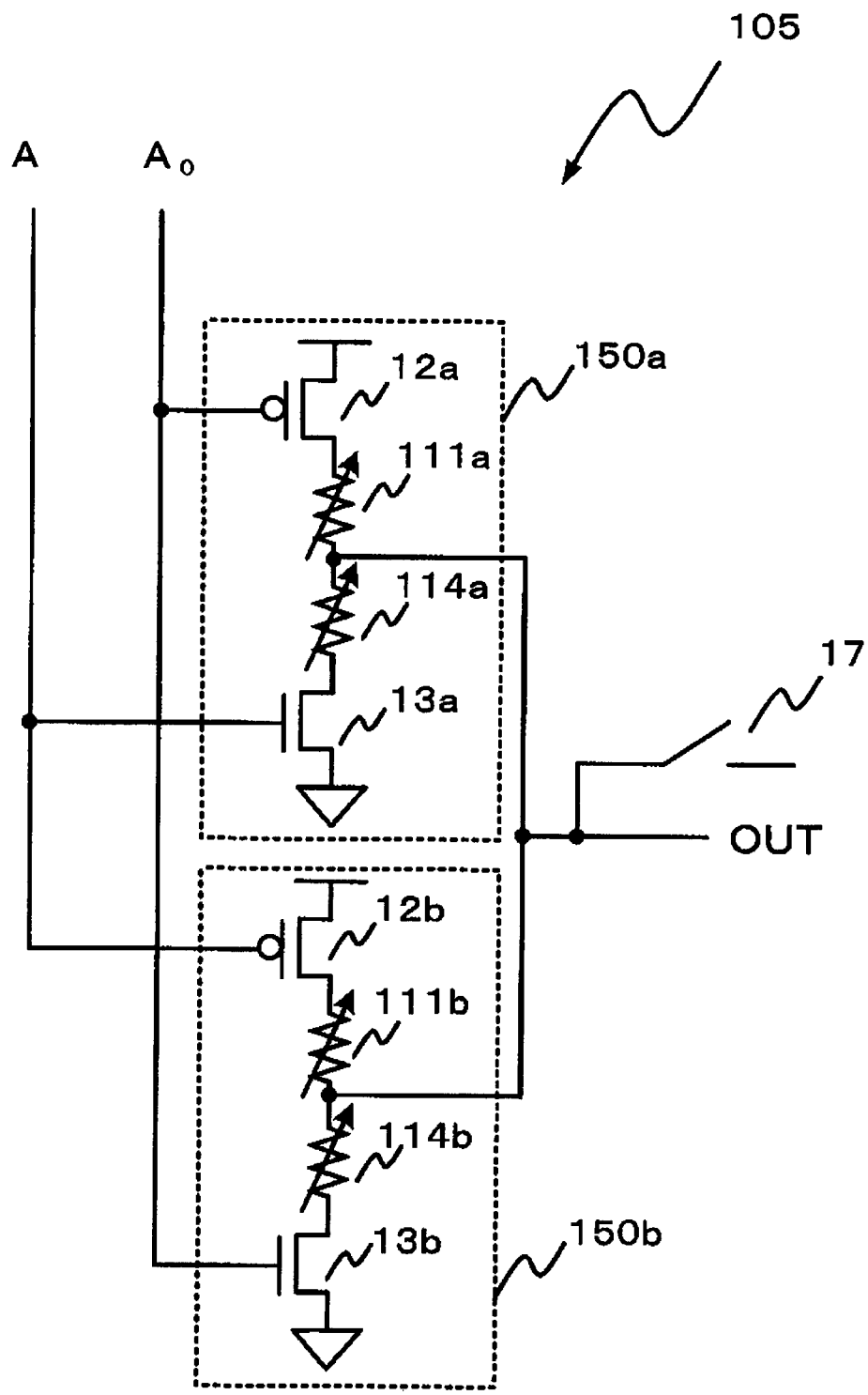
FIG. 12 is a circuit diagram showing further another modification of the LUT circuit of the FPGA according to the second embodiment.

Further, FIG. 12 shows further another modified example of the LUT circuit of the second embodiment. As shown in FIG. 12, similarly to the LUT circuit 4 of FIG. 7, the MOSFET 12a of a memory cell 150a and the MOSFET 12b of a memory cell 150b are connected nearer to the first power source than the flash memories 111a, 111b, and the MOSFETs 13a of the memory cell 150a and the MOSFET 13b of the memory cell 150b are connected nearer to the second power source than the flash memories 114a, 114b. In the first embodiment, due to the positional relationship between the flash memories and the MOSFETs as shown in the LUT circuit 4 of FIG. 7, the MOSFETs need to be turned on when data is written to the flash memories or data is erased from the flash memories. However, in the LUT circuits 101 to 105 according to the second embodiment shown in FIGS. 8 to 12, the process for writing data to the resistance change memories and for erasing data from the resistance change memories are the same.

Figure 13:
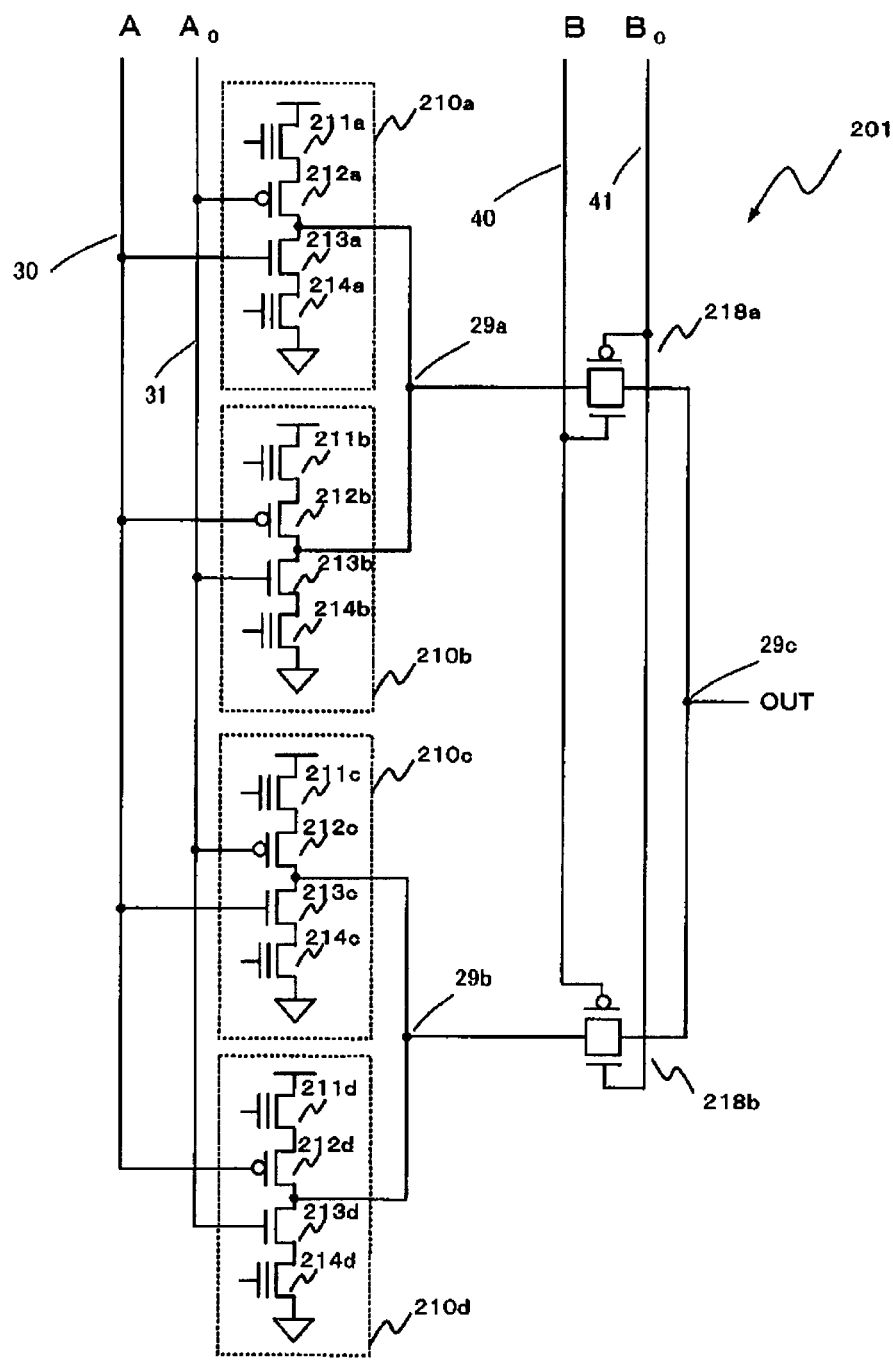
FIG. 13 is a circuit diagram showing a configuration of an LUT circuit of an FPGA according to a third embodiment.

FIG. 13 shows an LUT circuit of an FPGA according to a third embodiment. The LUT circuit 201 has a configuration of multiple inputs and a single output. The constituent elements other than the LUT circuit 201 of the FPGA are similar to those of the first embodiment. In the third embodiment and the following embodiments, an LUT circuit of multiple inputs and a single output is composed of flash memories of a floating gate type. The LUT circuit may be composed of the resistance change memories described in the second embodiment.

The LUT circuit 201 shown in FIG. 13 is provided with four memory cells 210a to 210d and transmission gates 218a, 218b. The number of the memory cells is two times the number of input signals. The memory cells 210a to 210d include flash memories 211a to 211d, 214a to 214d, P-channel MOSFETs 212a to 212d, and N-channel MOSFETs 213a to 213d.

Any one of the configurations of the first and the second embodiments and the modified examples of the first and the second embodiments can be applied to the memory cells 210a to 210d.

Each of the transmission gates 218a, 218b is composed of a P-channel MOSFET and an N-channel MOSFET connected in parallel with each other. An output node 29a of the first memory cell 210a and the second memory cell 210b is connected to an input terminal of the first transmission gate 218a. An output node 29b of the third memory cell 210c and the fourth memory cell 210d is connected to an input terminal of the second transmission gate 218b.

A first input signal "A" inputted into the LUT circuit 201 is inputted into the control gates of the MOSFETs 213a, 212b, 213c and 212d provided in the memory cells 210a to 210d. A first inverted signal "$A_0$" of the first input signal "A" is inputted into the control gates of the MOSFETs 212a, 213b, 212c and 213d provided in the memory cells 210a to 210d.

The first input signal "A" turns on the MOSFET 213a or 212b included in the first and the second memory cell 210a, 210b. Further, the first input signal "A" turns on the MOSFET 213c or 212d included in the third and the fourth memory cell 210c, 210d. The first inverted signal "$A_0$" turns on the MOSFET 212a or 213b included in the first and the second memory cell 210a, 210b. Further, the first inverted signal "$A_0$" turns on the MOSFET 212c or 213d included in the third and the fourth memory cell 210c, 210d. In each of the flash memories 211a to 211d and 214a to 214d, data is written in the same manner as described in the explanation regarding the first embodiment.

As a result, either one of output values of the first memory cell 210a and the second memory cell 210b is inputted into the transmission gate 218a, and either one of output values of the third memory cell 210c and the fourth memory cell 210d is inputted into the transmission gate 218b.

A second input signal "B" inputted into the LUT circuit 201 is inputted into the control gates of the N-channel MOSFETs of the transmission gate 218a, 218b. A second inverted value "$B_0$" of the second input signal is inputted into the control gates of the N-channel MOSFETs of the transmission gate 218a, 218b.

Thus, either one of the transmission gates 218a, 218b is turned on according to the second input signal "B" and the second inverted value "$B_0$", and outputs a signal to the output node 29C.

In the LUT circuit 201 having such a configuration, either one of two memory cells connected to one transmission gate is turned off according to the first input signal "A" and the first inverted value "$A_0$". Consequently, leakage current of a half of the memory cells is cut off during running of the LUT circuit 201 so that the leakage current can be reduced by about 50%.

The LUT circuit 201 having two inputs and one output has been described above referring to FIG. 13. An LUT circuit having an arbitrary number of inputs can be provided. Such an LUT circuit can be composed of a plurality of the memory cell employed in each of the LUT circuits of the first and the second embodiments and the modified examples. The outputs of the memory cells are selected by transmission gates which operate according to a second input signal, and further, the outputs from transmission gates which operate according to an (i−1)-th input signal are selected by transmission gates which operate according to an i-th input signal. "i" is the number of the input signals to the LUT circuit. "i" is three or more. Such a selection by the transmission gates is repeatedly performed. Even when the number of inputs is large, leakage currents of a half of the memory cells are cut off according to a first input signal and the leakage current can be reduced by about 50%.

In the description of the LUT circuit 201 of the third embodiment shown in FIG. 13 described above, the output signal is controlled using the transmission gates according to the second input signal "B" and the second inverted value "$B_0$". In this case, the elements to be used to control signals according to the second input signal is not limited to the transmission gates. The signals may be controlled using pass transistors which uses N-channel MOSFETs or P-channel MOSFETs.

Figure 14:
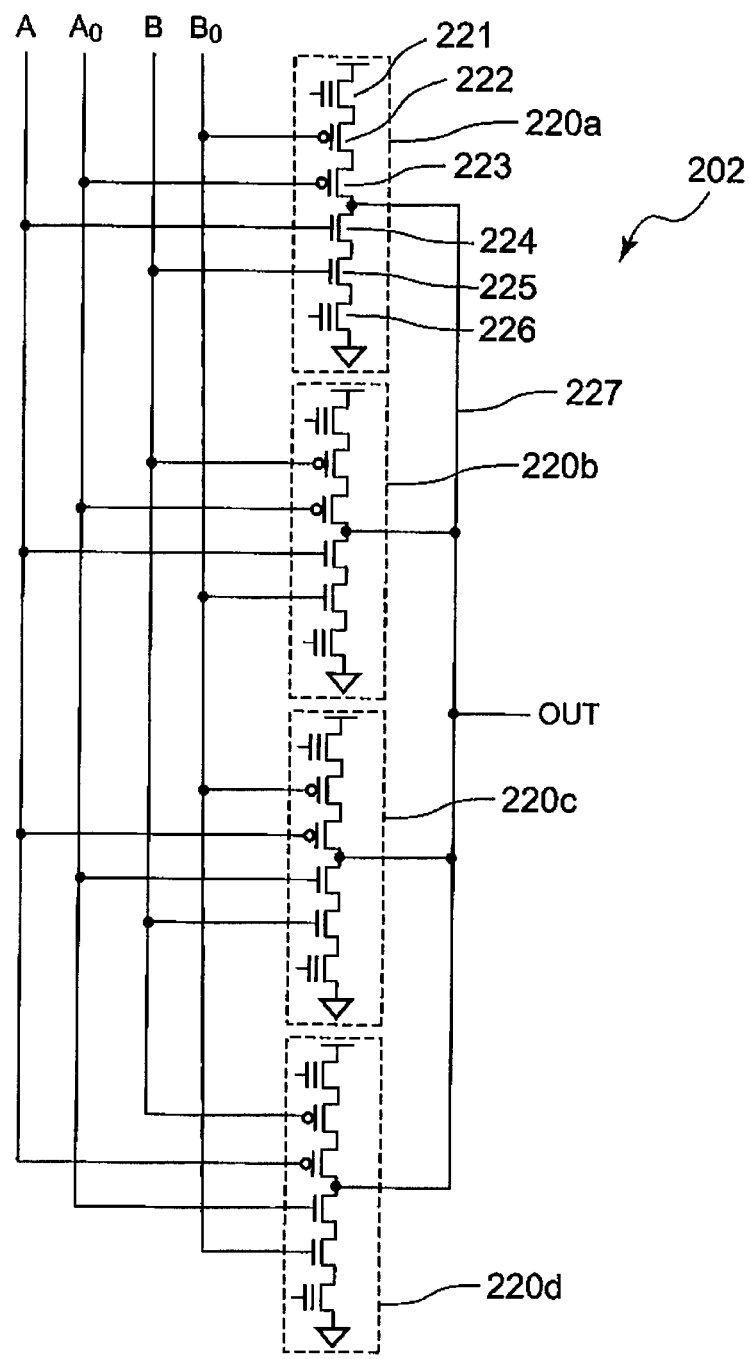
FIG. 14 is a circuit diagram showing a configuration of an LUT circuit of an FPGA according to a fourth embodiment.

FIG. 14 shows an LUT circuit of an FPGA according to a fourth embodiment. The LUT circuit 202 has a configuration of multiple inputs and a single output. The constituent elements other than the LUT circuit 202 of the FPGA are similar to those employed in the first embodiment. In the fourth embodiment, MOSFETs for cutting off leakage current are provided in each memory cell. The number of the MOSFETs corresponds to the number of input signals "A", "B". Further, input signals "A", "B" to the LUT circuit 202 and the inverted signals "$A_0$", "$B_0$" of the input signals are transmitted to each memory cell.

The LUT circuit of the fourth embodiment will be described below in detail. In FIG. 14, the LUT circuit 202 is provided with four memory cells 220a to 220d, the number of which is two times the number of the input signals "A", "B". Each of the memory cells 220a to 220d is provided with two flash memories 221, 226, P-channel MOSFETs 222, 223 which receive the inverted signals "$A_0$", "$B_0$", and N-channel MOSFETs 224, 225 which receive the input signals "A", "B".

The number of the P-channel MOSFETs included in each memory cell is same as the number of the input signals. The number of N-channel MOSFETs included in one memory cell is same as the number of the input signals. The two flash memories 221, 226, the P-channel MOSFETs 222, 223, and the N-channel MOSFETs 224, 225 are connected in series. Each of the memory cells 220a to 220d outputs a signal via an output wiring 227.

The LUT circuit of the fourth embodiment is not limited to the configuration shown in FIG. 14. It is possible to use the positional relationship among the flash memories and the MOSFETs of each of the memory cells provided in the LUT circuits according to the first and the second embodiments and the modified examples.

The channel types of the MOSFETs and the input signals to be inputted to the control gates of the MOSFETs can be appropriately changed.

According to the LUT circuit 202 shown in FIG. 14, 50% of the leakage current can be reduced by the first input signal "A", and further 50% of the remaining 50% of the leakage current can be reduced by the second input signal "B". Totally, 75% of the leakage current can be reduced.

Further, when the number of input signals is three or more, an LUT circuit for reducing leakage current can be realized by inserting MOSFETs which cut off a large part of the leakage current. The number of the MOSFETs corresponds to the number of the input signals in each memory cell.

More specifically, when the number of input signals transmitted to an LUT circuit is "m", one flash memory and m pieces of MOSFETs may be provided between an output wiring of each of $2^m$ pieces of memory cells and the first power source, and one flash memory and "m" pieces of MOSFETs may be provided between the output wiring and the second power source. The MOFSETs of at least one of the $2^m$ pieces of memory cells should be turned on according to the "m" pieces of input signals. "m" is an integer greater than or equal three.

Figure 15:
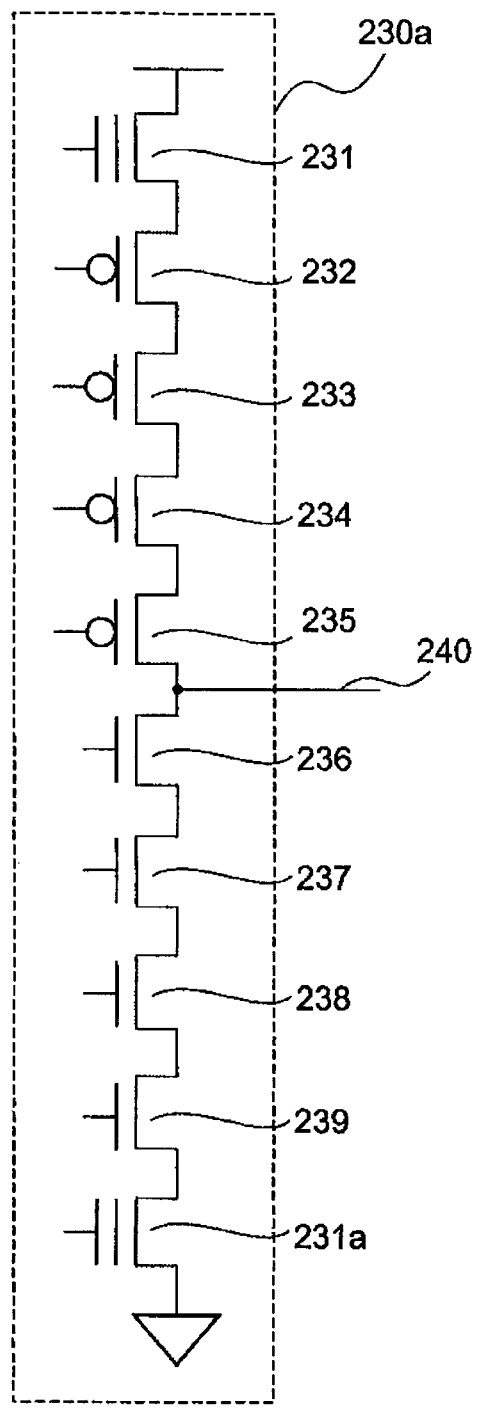
FIG. 15 is a circuit diagram showing a configuration of memory cells included in an LUT circuit of an FPGA.

FIG. 15 shows an example of a memory cell having a configuration of four inputs. As shown in FIG. 15, a memory cell 230a is provided with two flash memories 231, 231a, P-channel MOSFETs 232 to 235 and N-channel MOSFETs 236 to 239. The N-channel MOSFETs 236 to 239 receive input signals respectively. The P-channel MOSFETs 232 to 235 receive inverted signals respectively. The number of the P-channel MOSFETs 232 to 235 is the same as the number of the input signals. The number of the N-channel MOSFETs 236 to 239 is the same as the number of the input signals. The two flash memories 231, 231a, the P-channel MOSFETs 232 to 235 and the N-channel MOSFETs 236 to 239 are connected in series. The memory cell 230a outputs an output signal via an output wiring 240. A plurality of such a memory cell composes an LUT circuit.

According to such a memory cell, each time the number of the MOSFETs for cutting off the leakage current and the number of the input signals inputted into the control gates of the MOSFETs are increased, the leakage current can be reduced by 50%. Thus, an LUT circuit of low power consumption can be realized.

When the operation of such an LUT circuit may becomes unstable due to connecting many MOSFETs in series, it is possible to operate the LUT circuit more stably by providing elements such as transmission gates or pass transistors as described in the third embodiment. In this case, the output signals from the memory cells should be selected by providing some of the input signals transmitted to the LUT circuit to the elements.

Specifically, in each memory cell of an LUT circuit which receives a plurality of input signals, one flash memory and "n" pieces of MOSFETs may be provided between an output wiring extending from the memory cell and the first power source, and one flash memory and "n" pieces of MOSFETs may be provided between the output wiring and the second power source. "n" is an integer greater than or equal to one. The selection of an output by "n" pieces of the input signals is performed in the memory cells, and the selection of an output by the remaining input signal is performed using elements such as transmission gates and pass transistors.

Figure 16:
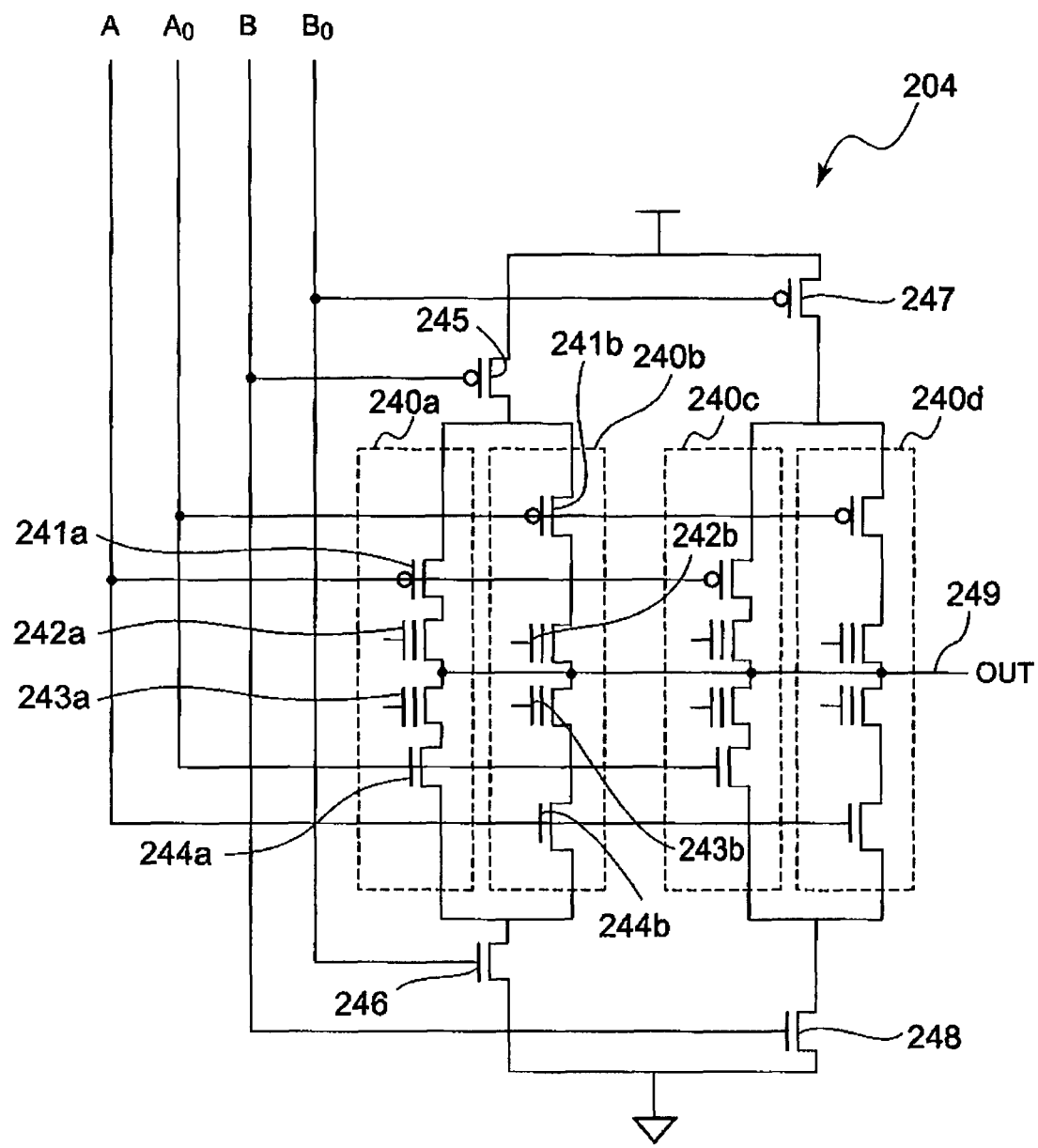
FIG. 16 is a circuit diagram showing a configuration of an LUT circuit of an FPGA according to a fifth embodiment.

FIG. 16 shows an LUT circuit of an FPGA according to a fifth embodiment. The LUT circuit 204 has a configuration of multiple inputs and a single output. The constituent elements other than the LUT circuit 204 in the FPGA are similar to those employed in the first embodiment. The LUT circuit 204 is provided with four memory cells 240a to 240d having the same configuration as that of the memory cell 40a or the memory cell 40b shown in FIG. 7.

For example, in the memory cell 240a, a P-channel MOSFET 241a, flash memories 242a, 243a, and an N-channel MOSFET 244a are arranged in series between the first power source of a higher voltage side and the second power source of a lower voltage side. Further, in the memory cell 240b, a P-channel MOSFET 241b, flash memories 242b, 243b, and an N-channel MOSFET 244b are arranged in series between the first power source of the higher voltage side and the second power source of the lower voltage side.

The P-channel MOSFET 241a and the N-channel MOSFET 244b receive an input signal "A". The P-channel MOSFET 241b and the N-channel MOSFET 244a receive the inverted signal "$A_0$" of the input signal "A". A P-channel MOSFET 245 is connected between the memory cells 240a, 240b and the first power source. An N-channel MOSFET 246 is connected between the memory cells 240a, 240b and the second power source. A P-channel MOSFET 247 is connected between the memory cells 240c, 240d and the first power source. An N-channel MOSFET 248 is connected between the memory cells 240c, 240d and the second power source. The P-channel MOSFET 245 and the N-channel MOSFET 248 receive an input signal "B". The P-channel MOSFET 247 and the N-channel MOSFET 246 receive the inverted signal "$B_0$" of the input signal "B". The memory cells 240a to 240d output an output signal via an output wiring 249.

According to this configuration, current flows in one of the memory cells 240a to 240d according to the input signals "A", "B" and the inverted signals "$A_0$", "$B_0$". Accordingly, the leakage current can be largely reduced.

When the operation of each of the memory cells 240a to 240d may become unstable due to connecting many MOSFETs in series, it is possible to operate the memory cells more stably by providing elements such as transmission gates and pass transistors as described in the third embodiment. In this case, the output signals from the memory cells should be selected by transmitting some of the input signals inputted to the LUT circuit to the elements.

As described above, according to the above embodiments, it is possible to reduce the leakage current of unused memory cells during running of each LUT circuit so that low power consumption can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a plurality of memory cells, each of the memory cells having first and second non-volatile memories and a plurality of switching elements, the first and second non-volatile memories and the switching elements being connected in series between a first power source and a second power source,
   wherein output wirings of at least two of the memory cells are connected to each other, and an input wiring is connected with control gates of the switching elements included in each of the at least two memory cells in order to send an input signal or an inverted signal of the input signal to the control gates, and
   wherein the memory cells are configured such that a plurality of the switching elements included in one of the at least two of the memory cells are turned off when the input signal or the inverted signal is inputted, and that another plurality of the switching elements included in another one of the at least two of memory cells other than the one of the at least two memory cells are turned on when the input signal or the inverted signal is inputted.

2. The semiconductor integrated circuit according to claim 1,
wherein, in each of the memory cells, the first non-volatile memory and at least one of the switching elements are connected in series between the first power source and one of the output wirings, the second non-volatile memory and the rest of the switching elements are connected in series between the second power source and the other one of the output wirings, and the number of the at least one of the switching elements and the number of the rest of the switching elements are same.

3. The semiconductor integrated circuit according to claim 1,
wherein, in each of the memory cells, one terminal of the first non-volatile memory is connected to the first power source, the switching elements are connected between another terminal of the first non-volatile memory and one terminal of the second non-volatile memory, and another terminal of the second non-volatile memory is connected to the second power source.

4. The semiconductor integrated circuit according to claim 1,
wherein, in each of the memory cells, one terminal of the first non-volatile memory is connected to one terminal of the second non-volatile memory, at least one of the switching elements are connected between another terminal of the first non-volatile memory and the first power source, and at least one of the switching elements are connected between another terminal of the second non-volatile memory and the second power source.

5. The semiconductor integrated circuit according to claim 1, wherein the first and the second non-volatile memories are memory elements of a structure having a floating gate.

6. The semiconductor integrated circuit according to claim 1, wherein the first and the second non-volatile memories are a resistance change memory element.

7. The semiconductor integrated circuit according to claim 1, further comprising selection elements to receive output signals from the memory cells and to select one of the output signals from the output wirings according to an input signal other than the input signal provided to one of the input wirings.

8. The semiconductor integrated circuit according to claim 1,
wherein the at least two of the memory cells include first and second memory cells, switching elements of the each of the first and second memory cells have the same channel type, the switching elements of each of the first and second memory cells are connected in series and the connected node is connected with each of the output wirings, and the input wiring for sending the input signal is connected with the control gates of the switching elements of the first memory cell and the second input wiring for sending the inverted signal is connected with the control gates of the switching elements of the second memory cell.

9. The semiconductor integrated circuit according to claim 1,
wherein the at least two of the memory cells include first and second memory cells, the switching elements of the first memory cell have a first channel type, the switching elements of the second memory cell have a second channel type other than the first channel type, the switching elements of each of the first and second memory cells are connected in series, the connected node is connected with each of the output wirings, and the input wiring is commonly connected with the control gates of the switching elements of the first and second memory cells in order to send the input signal to the control gates.

10. A semiconductor integrated circuit comprising:
a plurality of memory cells including first and second memory cells, each of the memory cells having first and second non-volatile memories, a first switching element having a first channel type and a second switching element having a second channel type, the first and second non-volatile memories and the first and second switching elements being connected in series between a first power source and a second power source,
wherein output wirings of the first and second memory cells are connected to each other, a first input wiring is connected with a first control gate of the first switching element of the first memory cell in order to send an input signal to the first control gate, a second input wiring is connected with a second control gate of the second switching element of the first memory cell in order to send an inverted signal of the input signal to the second control gate, and
wherein the second input wiring is connected with a first control gate of the first switching element of the second memory cell, and the first input wiring is connected with a second control gate of the second switching element of the second memory cell.

11. The semiconductor integrated circuit according to claim 10,
wherein, in each of the first and second memory cells, the first non-volatile memory and n pieces of the first switching element are connected in series between the first power source and the output wiring of the first memory cell, and the second non-volatile memory and n pieces of the second switching element are connected in series between the second power source and the output wiring of the second memory cell, where $n \geq 1$.

12. The semiconductor integrated circuit according to claim 10,
wherein, in each of the first and second memory cells, one terminal of the first non-volatile memory is connected to the first power source, the first and second switching elements are connected between another terminal of the first non-volatile memory and one terminal of the second non-volatile memory, and another terminal of the second non-volatile memory is connected to the second power source.

13. The semiconductor integrated circuit according to claim 10,
wherein, in each of the first and second memory cells, one terminal of the first non-volatile memory is connected to one terminal of the second non-volatile memory, the first switching element is connected between another terminal of the first non-volatile memory and the first power source, and the second switching element is connected between another terminal of the second non-volatile memory and the second power source.

14. The semiconductor integrated circuit according to claim 10, wherein the first and the second non-volatile memories are memory elements of a structure having a floating gate.

15. The semiconductor integrated circuit according to claim 10, wherein the first and the second non-volatile memories are a resistance change memory element.

16. The semiconductor integrated circuit according to claim 10, further comprising selection elements connected with the output wirings to receive output signals from the first and second memory cells and to select one of the output signals according to an input signal other than the input signal provided to the first input wiring.

\* \* \* \* \*